United States Patent [19]

Broussoux et al.

[11] 4,427,609
[45] Jan. 24, 1984

[54] PROCESS FOR PRODUCING PIEZOELECTRIC POLYMER FILMS

[75] Inventors: Dominique Broussoux; Hugues Facoetti; François Micheron, all of Paris, France

[73] Assignee: Thomson-CSF, Paris, France

[21] Appl. No.: 302,782

[22] Filed: Sep. 16, 1981

[30] Foreign Application Priority Data

Sep. 19, 1980 [FR] France .................................. 80 20213

[51] Int. Cl.³ .......................... B29D 7/24; H01G 7/02
[52] U.S. Cl. ........................................ 264/22; 264/24; 264/104; 264/108; 264/280; 307/400; 428/412; 428/421
[58] Field of Search .................... 264/22, 24, 25, 26, 264/104, 288.4, 108, 280; 307/400; 428/421, 412

[56] References Cited

U.S. PATENT DOCUMENTS

| | | | |
|---|---|---|---|
| 3,691,264 | 9/1972 | Asahina | 264/22 |
| 3,833,503 | 9/1974 | Murayama et al. | 307/400 |
| 3,878,274 | 4/1975 | Murayama et al. | 264/22 |
| 3,931,446 | 1/1976 | Murayama et al. | 428/421 |
| 3,943,614 | 3/1976 | Yoshikawa et al. | 264/22 |
| 3,967,027 | 6/1976 | Igarashi et al. | 428/421 |
| 3,985,914 | 10/1976 | Sasaki et al. | 427/12 |
| 4,055,878 | 11/1977 | Radice | 307/400 |
| 4,079,437 | 3/1978 | Sheffield | 361/233 |
| 4,127,681 | 11/1978 | Ferren et al. | 264/22 |
| 4,241,128 | 12/1980 | Wang | 428/421 |
| 4,268,653 | 5/1981 | Uchidoi et al. | 428/421 |
| 4,284,921 | 8/1981 | Lemonon et al. | 310/322 |
| 4,290,983 | 9/1981 | Sasaki et al. | 264/22 |
| 4,302,408 | 11/1981 | Ichihara et al. | 264/22 |
| 4,308,370 | 12/1981 | Fukada et al. | 264/22 |
| 4,340,786 | 7/1982 | Tester | 264/22 |
| 4,346,505 | 8/1982 | Lemonon et al. | 264/22 |

FOREIGN PATENT DOCUMENTS

| | | | |
|---|---|---|---|
| 2845255 | 4/1979 | Fed. Rep. of Germany | 264/26 |
| 49-121198 | 11/1974 | Japan . | |
| 50-77897 | 6/1975 | Japan | 264/27 |
| 51-45798 | 6/1976 | Japan . | |
| 51-85499 | 7/1976 | Japan | 428/421 |
| 55-51940 | 12/1980 | Japan . | |
| 56-116749 | 6/1981 | Japan . | |
| 57-97627 | 2/1982 | Japan . | |

OTHER PUBLICATIONS

*Polymer*, Matsushige et al., "The II–I Crystal Transformation of PVDF Under Tensile and Compressional Stresses", 1980, 21(12), pp. 1391–1397.

*Structure and Properties of Piezoelectric Polymers*, Matsushige et al., 3-1980.

"Piezoelectricity of Corona-Poled PVDF", *Kobunshi Ronbunshu*, 1979, 36(10), pp. 685–688, (Japan).

Primary Examiner—Jeffery R. Thurlow
Attorney, Agent, or Firm—Cushman, Darby & Cushman

[57] ABSTRACT

The invention relates to piezoelectric polymer films.

The invention relates to a production process consisting of stretching a polymer material blank by rolling under an electrical field between two oppositely rotating rollers.

The invention is more particularly applicable to the production of electromechanical transducers, whose active elements are constituted by piezoelectric polymer films provided with electrodes.

14 Claims, 7 Drawing Figures

PROCESS FOR PRODUCING PIEZOELECTRIC POLYMER FILMS

BACKGROUND OF THE INVENTION

The present invention relates to piezoelectric polymers in the form of single or multilayer films. Piezoelectric properties are manifested when these films are placed between two electrodes and an electrical voltage is applied to the latter. Deformations then occur in a direction perpendicular to the faces and in two directions contained in the plane tangential to the faces. Conversely under the action of a mechanical stress a voltage proportional to the stress is produced by a reverse piezoelectric effect. The obtaining of piezoelectric properties devolves from the existence of a permanent dipolar orientation which does not exist when the material crystallizes from the molten state. Thus, at this stage the polymer material is in a non-polar $\alpha$ phase.

Among the polymer materials which are able to acquire piezoelectric properties reference can be made to polyvinyl chloride PVC, polyvinyl fluoride PVF, polyvinylidene fluoride $PVF_2$ and its copolymers with polytetraluoroethylene PTFE, polytrifluoroethylene $PT_rFE$, polyvinyl fluoride PVF and mixtures using polymethyl methacrylate PMMA.

It is known to carry out two successive treatments of these materials, particularly polyvinylidene fluoride $PVF_2$ by exerting a pulling action thereon in order to obtain irreversible elongations which can reach 300 to 500%, which transforms the initial phase into a polarizable phase and said phase is then oriented under the action of a strong electric field close to the dielectric strength limit of the film.

The conventional production operations are generally carried out successively and independently. They consist of the formation by melting of granular materials and the cooling under a press of a plate-like blank, the mechanical stretching of the blank between the jaws of a pulling machine and polarization of the stretched film by applying a voltage between electrodes deposited on the film or by corona discharge.

In connection with the stretching of the film a continuous treatment operation is possible, which consists of winding the film from a supply reel on to a take-up reel, which rotates at a higher speed. Bearing in mind the forces involved it soon becomes clear that this method can only be used for thin films whose thickness does not exceed 50 microns and provided that the said films are heated to temperatures equal to or above the thermoplasticity threshold.

With regards to the continuous polarization it is possible to pass the previously stretched film between a supply reel and a take-up reel revolving at the same speed. The application of a corona discharge to the unwound film makes it unnecessary to apply a metal coating to at least one of the faces of the film. Metallization of the stretched film can also be obviated by passing it between two fixed electrodes or two conductive rollers. However, none of these polarization processes is completely satisfactory, because the electric field necessary for obtaining satisfactory piezoelectric coefficients are too close to the breakdown fields. It is necessary to select an adequate polarization temperature to enable the bipolar orientation mobility to take place, which leads to a temperature of at least 80° C., in the case of polyvinylidene fluoride. At this temperature the ionic conductivity lowers the dielectric breakdown threshold in such a way that the electric field which can be applied in practice is the result of a compromise. Unless a complete dipolar orientation takes place the piezoelectric coefficients obtained in a reproducible manner are for $d_{33}$ below 18 pc $N^{-1}$ and by increasing the field with a breakdown risk below 22 pc $N^{-1}$. On the basis of what has been stated hereinbefore it is apparent that there is a considerable need for a continuous production process having a reproducibility level close to unity making it possible to treat films which are as thick as 1 mm and which produces oriented films, whose piezoelectric coefficients exceed the hitherto obtained values.

BRIEF SUMMARY OF THE INVENTION

The present invention is based on two important findings, which are that the rolling process makes it possible to stretch very thick films at temperatures close to ambient temperature and that in the case of polyvinylidene fluoride low temperature stretching aids the transition of the non-polar $\alpha$ phase towards the polar $\beta$ phase. It can be added that the electrical polarization fields can be considerably reduced when the films are crystallized beforehand under uniaxial pressure, because the crystalline axes a and b perpendicular to the direction of the macromolecular chains are already partly oriented with respect to the plane of the film.

The present invention therefore relates to a process for the production of a piezoelectric polymer film by mechanical stretching and electrical polarization, wherein it consists of forming a wafer shaped polymer material blank, whose thickness exceeds that of the film and reducing the thickness of this blank by a rolling operation under an electric field, which produces the said mechanical stretching and simultaneously the said electrical polarization.

The invention also relates to a piezoelectric structure, wherein it comprises at least one polymer material film rolled under an electric field.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

The transformation of piezoelectric films is relevant to a large number of polymer materials, copolymers or mixtures thereof, including those referred to hereinbefore. Preference is more particularly given to polyvinylidene fluoride, because it is suitable for obtaining particularly good piezoelectric properties. The structure of this material comprises spherulitic crystalline clusters contained in an amorphous phase. The macroscopic mechanical properties are those of an isotropic body. Three crystalline forms can be distinguished. The $\alpha$ phase is obtained from the molten polymer. The macromolecular chains are helically wound and the arrangement of the carbon, hydrogen and fluorine atoms is such that the electrical dipole elements compensate one another when advancing along the chain. The two other $\beta$ and $\gamma$ phases are less stable than the $\alpha$ phase. The $\beta$ phase can be induced by stretching the material, because the chains assume a zig-zag configuration permitting the electrical dipole moments to add their effects. The $\gamma$ phase is a polar phase which can be electrically oriented.

By carrying out a unidirectional stretching followed by a polarization in the polar phase, piezoelectric properties are developed in a permanent manner. The rank three tensor $d_{ijk}$ makes it possible to represent these piezoelectric properties as follows:

$$d_{ikj} = \begin{vmatrix} 0 & 0 & 0 & 0 & d_{15} & 0 \\ 0 & 0 & 0 & d_{24} & 0 & 0 \\ d_{31} & d_{32} & d_{33} & 0 & 0 & 0 \end{vmatrix}$$

Figure 1:
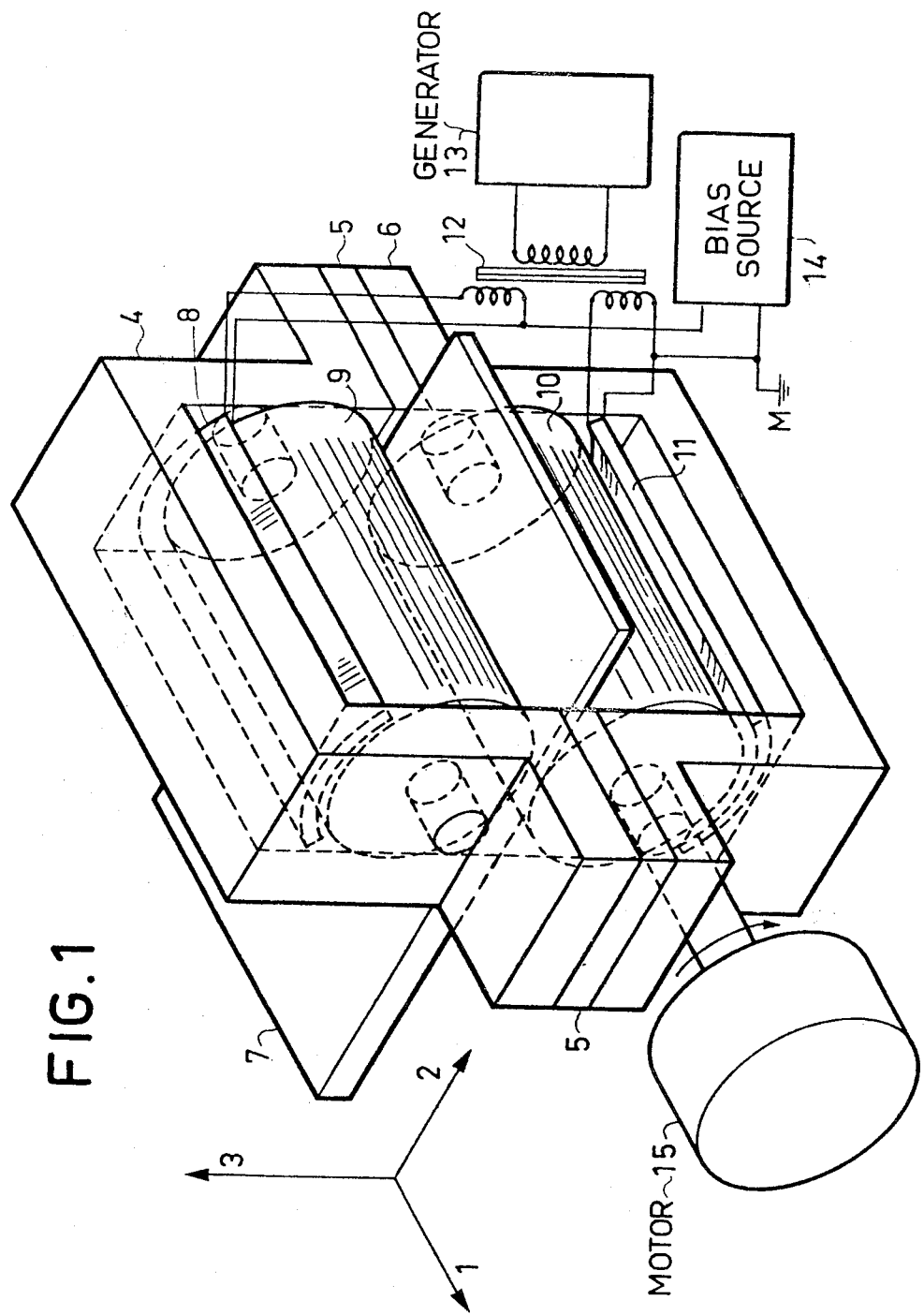
FIG. 1—an isometric view of a rolling device intended for the performance of the production process according to the invention.

FIG. 1 shows a polymer blank 7 during rolling and a system of axes 1, 2, 3. Blank 7 is a disk, whose main faces are perpendicular to axis 3. Rolling causes a unidirectional stretching along axis 2 resulting from the thickness reduction of blank 7. The piezoelectric coefficients $d_{31}$, $d_{32}$ and $d_{33}$ relate to the system of axes 1, 2, 3 and are measured in picocoulomb/newton. The coefficients $d_{31}$ and $d_{32}$ have unequal values for a unidirectional stretching.

Before starting the detailed description of FIG. 1 it is worth indicating how blank 7 can be prepared with a view to treatment by rolling. It is possible to use a press, whose planar plates make it possible to melt the polyvinylidene fluoride granules with an average molecular weight M=80,000. A disk is formed at a temperature of 200° C. As a non-limitative example for forming a disk with a surface area of 220 cm² and a thickness of 0.7 mm a pressure of 22 metric tons is exerted and pressing lasts about 15 minutes. The solidified film is removed from the press and immersed in water to limit the growth of crystalline accumulations. The blank obtained is ready to be rolled in order to develop the piezoelectric effects therein.

According to a first feature of the invention blank 7 is stretched by rolling under an electric field, for which purpose a two-part rolling mill stand is used. The lower part, for example, comprises a steel roller 10 mounted in a very rigid metal cradle 6. The shaft of roller 10 is driven by a geared motor unit 15 making it possible, for example, to obtain an advance speed of blank 7 of approximately 0.09 mm/s. For rolling at a temperature of 60° C. the tangential force applied to the rollers is approximately 50 metric tons, leading to a stretching level of 3.8.

The upper part of the rolling mill stand comprises a second steel roller 9 mounted in a metal cradle 4. An insulating flange 5 is inserted from either side of the stand between the two cradles 4 and 5, which are joined by electrically insulated bolts, which are not shown in FIG. 1. If appropriate the upper roller 9 can be driven by an insulating coupling connecting it to the rolling mill stand 15. For reasons of clarity this coupling is not shown in FIG. 1.

Electric convection heaters 8 and 11 are installed in the vicinity of rollers 9 and 10 for the heating thereof. Heaters 8 and 11 are supplied by an alternating current source 13 via a transformer 12 with insulated secondaries. The two heaters 8 and 11 are electrically connected to the two cradles 4 and 6 and to a polarization source 14 supplying a high d.c. voltage. One of the terminals of source 14 is connected to earth M.

Bearing in mind the polarisation voltage value and the spacing of rollers 9 and 10, the electric field established in the crushing area of blank 7 is approximately 550 kV/cm. This value which does not exceed one third of the breakdown field of the gripped portion of blank 7 after rolling makes it possible to obtain a piezoelectric coefficient $d_{33}$ of 28 pC.N$^{-1}$. A value of $d_{33}=32$ pC.N$^{-1}$ is obtained by raising the polarization field to 750 kV/cm.

These very high piezoelectric values can be attributed to an ultraorientation effect associated with the exceptional circumstances involved in the rolling process under an electric field.

Thus, there is a simultaneous cooperation between the three following factors: as the film is initially in a non-polar phase the stretching which is possible at low temperature effectively converts this phase into a polar phase and the axis of the chains is parallel to the stretching direction. This transition under high pressure tends to orient the axes a and b of crystalline spherulitic clusters relative to the main faces of the rolled film. This transition as a result of the high pressures involved is accompanied by partial melting and recrystallization. Measurements performed before and after rolling show that the crystallinity has increased.

Through the use of low temperature melting it is possible to obtain a very considerable dipolar orientation mobility which is not accompanied by an ionic conductivity rise. Thus, the application of an electric field during rolling and in the area which is transformed leads to a high dipolar orientation level, to which corresponds a high piezoelectric activity, with a negligible risk of dielectric breakdown.

The simple rolling as illustrated in FIG. 1 can be converted into simultaneous rolling by superimposing several blanks 7. The dipolar orientations are along axis 3 and in the same direction.

It is also possible to carry out rolling with dipolar orientations in opposite directions without it being necessary to electrically insulate the two rollers.

Figure 2:
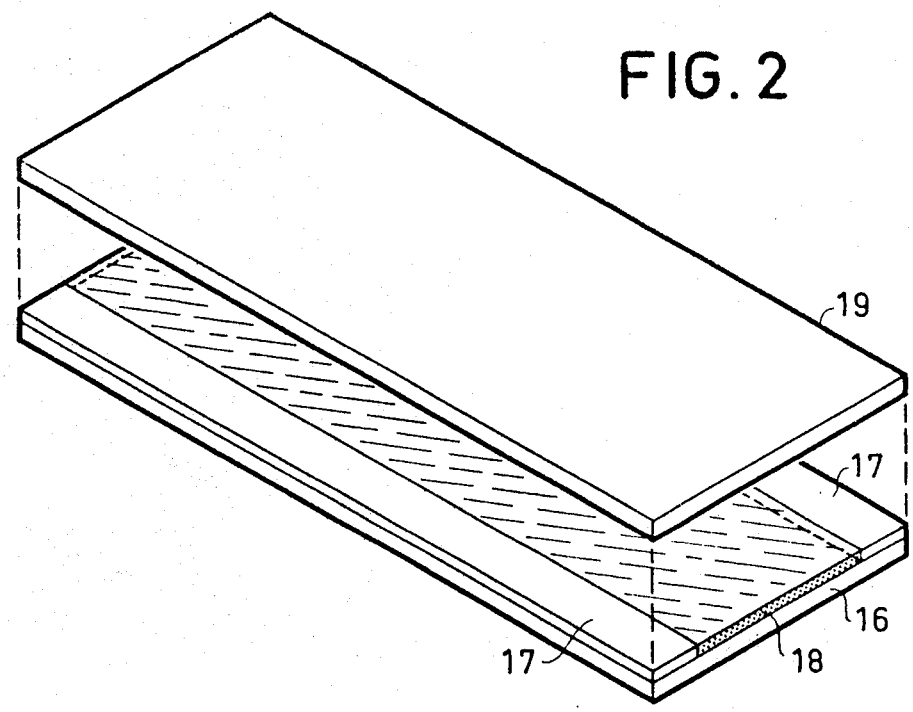
FIG. 2—an exploded view of a blank intended for the rolling of two polymer films.
Figure 3:
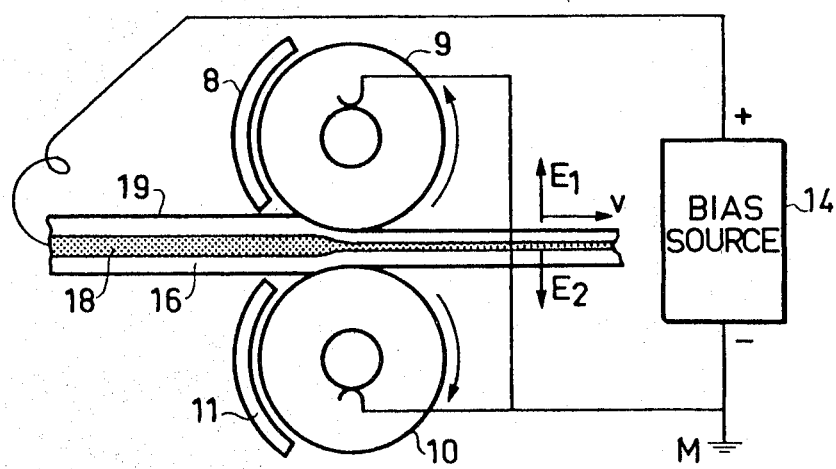
FIG. 3—an explanatory diagram relating to the rolling of the blank of FIG. 2.

FIG. 2 is an exploded view of a composite blank constituted by two polymer sheets 16 and 19. The upper sheet 19 rests on sheet 16 via two spacers 17 enclosing a liquid or pasty central electrode 18. The spacers 17 can be constituted by adhesive tapes preventing any lateral overflow of the fluid of electrode 18. During rolling intermediate electrode 18 undergoes deformation by elongation which can reach 400%. It is not possible to use for the production of intermediate electrode 18 thin aluminium films or evaporated metallic laters, because these cannot withstand such a high degree of stretching when cold. However, it is possible to produce by pouring or casting thin metal coatings with a low melting point, such as lead or Wood's alloy coatings. A preferred solution consists of using fluid conductors. To this end electrode 18 can be produced in the form of a gel made conductive by means of a salt or acid. Greases containing conductive particles of silver or carbon black are also suitable. As it involves an electrical polarization relating to dielectric materials it is sufficient if the electrodes have a low conductivity. Insulating tapes 17 prevent any untimely overflow of the fluid electrode 18 which could lead to a short-circuit or a breakdown between the electrode or the rollers. The diagram of FIG. 3 shows the electrical connections of the polarization generator 14. The two rollers 9 and 10 are connected to the earth terminal M, which is common to one of the terminals of generator 14. The other terminal of generator 14 is connected by a flexible connection to electrode 18. The rolling direction is indicative by arrow v and is parallel to tapes 17. Using the polarities indicated in FIG. 3 the polarizing electrical fields $E_1$ and $E_2$ are of opposite direction and directed towards the outside with respect to fibres 16 and 19.

Figure 4:
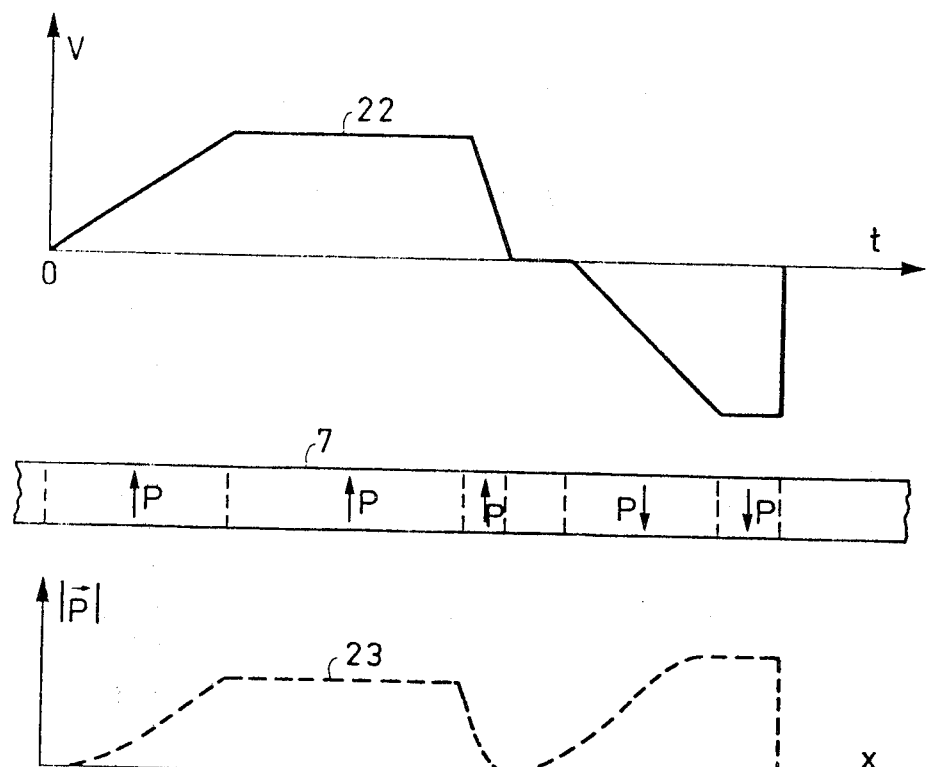
FIG. 4—an explanatory diagram.

Using the rolling devices and blanks shown in FIGS. 1 to 3 a transverse polarization P is carried out, because the electric field is oriented in perpendicular manner with respect to the main faces of the stretched film. The diagrams of FIG. 4 show that it is possible to vary in both magnitude and sign the polarization P of stretched film 7. To obtain a polarization intensity variation in the rolling direction x such as is represented by curve 23, a polarization voltage V is applied, which evolves in time in the manner shown by curve 22. To reverse the polarization direction it is merely necessary to reverse the sign of voltage V. In the case of FIGS. 2 and 3 the extent of the electrically polarized area made piezoelectric is determined by the extent of the intermediate electrode 8. Thus, it is possible to vary this extent by an appropriate delimitation of electrode 18. It is also possible to subdivide electrode 18 into a number of islets connected to independent polarization generators. Electrical continuity is ensured by bridging said islets in the rolling direction. Thus, there can be extreme variations in the magnitude, sign and extent of the remanent polarization.

Moreover, the two rolled films can be of the same or different natures. Thus, it is possible to roll a polyvinylidene fluoride film simultaneously with a polyethylene film. The polyethylene film does not acquire piezoelectric properties and instead serves as an electrical insulator, making it possible to use a standard known rolling mill.

Figure 5:
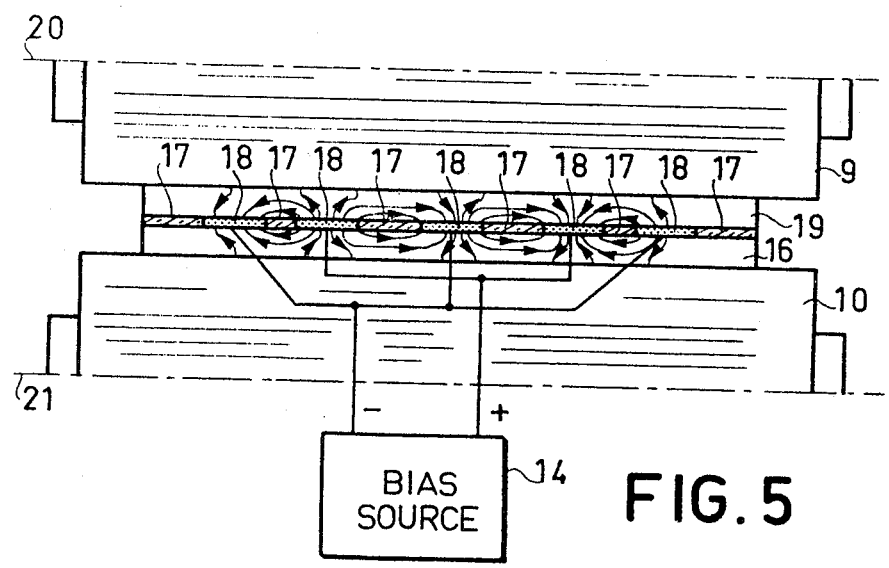
FIG. 5—an arrangement making it possible to obtain a dipolar orientation with a component parallel to the faces of the rolled films.

FIG. 5 partly shows two rolling rollers 9, 10 of rotation axes 20, 21. The blank rolled between these rollers differs from that of FIG. 2 in that the fluid electrode 18 is subdivided and occupies a number of compartments defined by spacers 17. The electrical polarization is not directly applied between electrode 18 and rollers 9, 10. On passing from left to right it is possible to see in FIG. 5 that the elementary electrodes 18 are alternately connected to the two poles of the polarization source 14. Thus, the electric field in films 16 and 19 has a component parallel to the main faces to the right of each insulating spacer or partition 17. It is therefore possible to obtain a dipolar orientation parallel to axes 20, 21.

The invention is in no way limited to the simultaneous rolling of two films.

Figure 6:
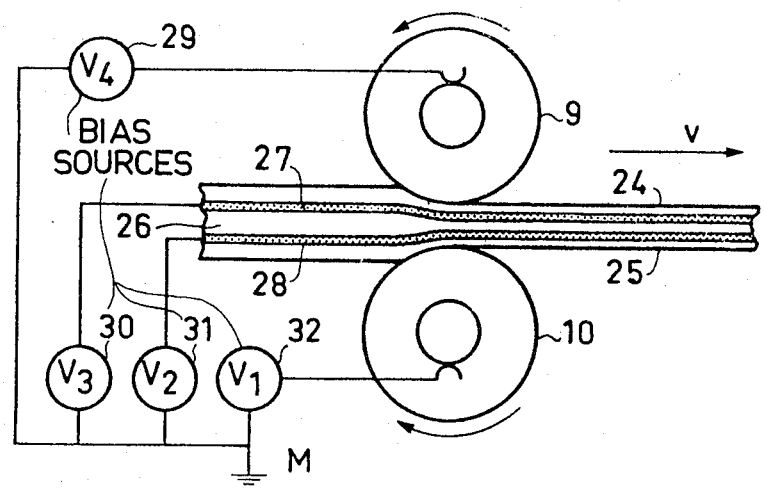
FIG. 6—the rolling of a laminated blank incorporating three polymer films.

In FIG. 6 it is possible to see a blank formed by superimposing three polymer films 24, 26, 25. Two intermediate fluid electrodes 27, 28 are provided for separating the films. Four voltage generators 29, 30, 31, 32 can be used for fixing the potentials $V_4$, $V_3$, $V_2$, $V_1$ applied to rollers 9, 10 and to electrodes 27, 28. Film 24 is exposed to voltage $V_4-V_3$, film 26 to voltage $V_3-V_2$ and film 25 to voltage $V_2-V_1$.

It is easy to see that one of these generators is superfluous when it is desired to polarize the three films in a random manner. If the two outer films 24, 25 are not to be polarized, it is only necessary to have a single generator connected to electrodes 27, 28. Roller 9 can then be connected to electrode 27 and roller 10 to electrode 28. Obviously it is possible to vary the potentials $V_1$, $V_2$, $V_3$, $V_4$ to obtain a modulation of the dipolar orientation in each of the films.

Figure 7:
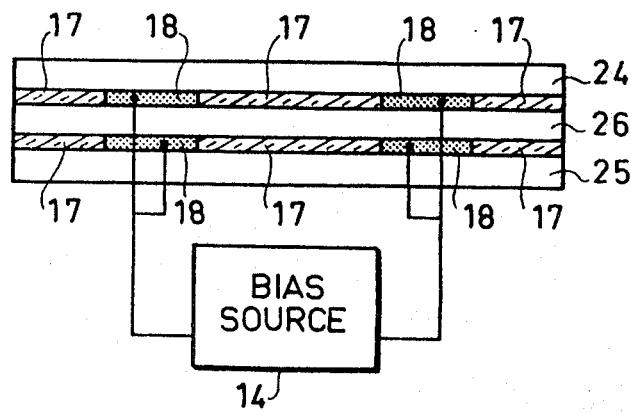
FIG. 7—a constructional variant of the blank of FIG. 6.

FIG. 7 is a sectional view of a three-layer type blank in which the fluid electrodes 18 are surrounded by spacers 17, which adopt the form of aligned tapes in the rolling direction (perpendicular to the plane of the drawing). As illustrated in FIG. 7 electrodes 18 are connected to generator 14 so as to create an electric field in films 24, 26, 25 with a component parallel to the axes of the rollers. This arrangement makes it possible to reduce the disturbing influence of the rollers on the distribution of the electric field induced by electrodes 18. Nothing prevents the provision of more than two rows of electrodes 18 for creating other electric field distributions with one or more polarization generators.

The stretched, polarized films are generally separable when they have been rolled simultaneously. However, it is possible to use the rolling of two identical films for obtaining bimorph piezoelectric structures. In this case the intermediate electrode 18 of FIGS. 2 and 3 is constituted by a thin coating of conductive glue. The CHOMERICS company produces a silver-filled epoxy adhesive under the tradename EPOTEX 58429. This adhesive is deposited, prior to polymerization, between spacers 17 by screen process printing, pouring, painting, spraying, etc. Rolling and polymerization are carried out immediately after depositing the conductive glue. Following rolling and polymerization the bimorph produced is kept at the temperature permitting the polymerization of the glue. In the case of EPOTEX 58429 glue the setting time is 24 hours at ambient temperature or five hours at 60° C. The polymerization temperature must be below the temperature at which depolarization of the polymer may take place. The depolarization temperature is 100° C. for polyvinylidene fluoride.

Finally it is pointed out that the production process can be adapted to continuous industrial production. The films constituting the blank to be rolled under the field can be obtained in the width of the rolling mill by extrusion. The continuous deposition of a fluid electrode causes no problems.

In addition, rolling can take place in the form of two successive passes when it is desired to obtain a two-dimensionally stretched material. In a first operation the e.g. square blank is rolled to a 270% elongation under a field in order to obtain a rectangular shape with a substantially unchanged width. This shape is again introduced into the rolling mill by its large side for a second rolling pass under the field. The two-dimensionally stretched film obtained has reassumed a square shape.

What is claimed is:

1. A process for the production of a piezoelectric polymer film by mechanical stretching and electrical polarization, comprising forming a wafer shaped polymer material blank in the α phase, whose thickness exceeds that of the film and reducing the thickness of this blank solely by a rolling operation between a pair of rollers defining between them a crushing area under an electric field applied across the thickness of the film in the crushing area and at a speed sufficiently slow to produce the said mechanical stretching and simultaneously the said electrical polarization.

2. A process according to claim 1, wherein the blank comprises a plurality of superimposed films, which are rolled simultaneously.

3. A process according to claim 2, wherein the blank is provided with at least one intermediate electrode.

4. A process according to claim 1, wherein the rolling operation is carried out by two oppositely rotating conductive rollers between which is applied a polarization voltage.

5. A process according to claim 3, wherein the rolling operation is performed by two oppositely rotating conductive rollers, the electrical polarization being obtained by connecting the intermediate electrode and the rollers to a voltage source.

6. A process according to claim 3, wherein the rolling operation is carried out by two oppositely rotating rollers, the polarization being obtained by applying a voltage between two intermediate electrodes.

7. A process according to claim 3, wherein the intermediate electrode is a fluid electrode which is transversely defined with respect to the rolling direction.

8. A process according to claim 7, wherein the fluid electrode is constituted by a polymerizable conductive adhesive substance.

9. A process according to claim 7, wherein several fluid electrodes are deposited on the same face of the film and insulated from one another by inserted dielectric partitions arranged in network form on the said face.

10. A process according to claim 1, wherein the electrical polarization is modulated during rolling.

11. A process according to claim 1, wherein the rolling temperature is below the thermoplasticity threshold of the polymer constituting the film.

12. A process according to claim 2, wherein the films are identical.

13. A process according to claim 2, wherein the films comprise at least one film which is able to acquire the piezoelectric properties and at least one film of another polymer material.

14. A process according to claim 1, wherein the blank is subject to two crossed rolling passes.

* * * * *